United States Patent
Liu et al.

(10) Patent No.: US 10,289,764 B1
(45) Date of Patent: May 14, 2019

(54) PARALLEL EXTRACTION OF WORST CASE CORNERS

(71) Applicant: Cadence Design Systems, Inc., San Jose, CA (US)

(72) Inventors: Hongzhou Liu, Sewickley, PA (US); Wangyang Zhang, Allison Park, PA (US)

(73) Assignee: Cadence Design Systems, Inc., San Jose, CA (US)

( * ) Notice: Subject to any disclaimer, the term of this patent is extended or adjusted under 35 U.S.C. 154(b) by 288 days.

(21) Appl. No.: 15/247,675

(22) Filed: Aug. 25, 2016

(51) Int. Cl.
*G06F 17/50* (2006.01)
*G06F 12/0875* (2016.01)

(52) U.S. Cl.
CPC ...... *G06F 17/5009* (2013.01); *G06F 12/0875* (2013.01); *G06F 2212/45* (2013.01)

(58) Field of Classification Search
CPC .................................................. G06F 17/5081
See application file for complete search history.

*Primary Examiner* — Vuthe Siek
*Assistant Examiner* — Aric Lin
(74) *Attorney, Agent, or Firm* — McDermott Will & Emery LLP (57) ABSTRACT

Methods and systems are provided. In one aspect, a method for parallel extraction of worst case corners of a number of electronic design automation (EDA) simulations includes generating multiple initial EDA simulation results for a number of specifications of an integrated circuit based on a first algorithm. For each specification, a respective first set of input samples is generated based on a second algorithm using generated multiple initial simulation results. Using a third algorithm, two or more of the respective first set of input samples are merged based on a criterion to generate a respective second set of input samples. For each specification, a first set of simulation results is generated using the respective second set of input samples. The worst case corners for the specifications are determined by applying in parallel local optimization to the first set of simulation results.

20 Claims, 10 Drawing Sheets

| Sample | Variable 1 | Variable 2 | Variable 3 |
|---|---|---|---|
| 1 | 2 | 2 | 2 |
| 2 | 1 | 2 | 2 |
| 3 | 2 | 1 | 2 |
| 4 | 2 | 3 | 2 |
| 5 | 2 | 2 | 1 |
| 6 | 2 | 2 | 3 |
| 7 | 2 | 2 | 4 |

| Sample | Spec 1 | Spec 2 |
|---|---|---|
| 1 | 0 | 0 |
| 2 | -1 | 4 |
| 3 | -2 | 4 |
| 4 | 2 | -2 |
| 5 | -3 | 1 |
| 6 | -2 | 2 |
| 7 | -1 | 3 |

| Sample | Variable 1 | Variable 2 | Variable 3 | Variable 4 | Variable 5 |
|---|---|---|---|---|---|
| 1 | $w_{i1}$ | $w_{i2}$ | $w_{i3}$ | $w_{i4}$ | $w_{i5}$ |
| 2 | $b_{i1}$ | $w_{i2}$ | $w_{i3}$ | $b_{i4}$ | $b_{i5}$ |
| 3 | $w_{i1}$ | $b_{i2}$ | $w_{i3}$ | $b_{i4}$ | $w_{i5}$ |
| 4 | $b_{i1}$ | $b_{i2}$ | $w_{i3}$ | $w_{i4}$ | $b_{i5}$ |
| 5 | $w_{i1}$ | $w_{i2}$ | $b_{i3}$ | $w_{i4}$ | $b_{i5}$ |
| 6 | $b_{i1}$ | $w_{i2}$ | $b_{i3}$ | $b_{i4}$ | $w_{i5}$ |
| 7 | $w_{i1}$ | $b_{i2}$ | $b_{i3}$ | $b_{i4}$ | $b_{i5}$ |
| 8 | $b_{i1}$ | $b_{i2}$ | $b_{i3}$ | $w_{i4}$ | $w_{i5}$ |

| Sample | Variable 1 | Variable 2 | Variable 3 | Variable 4 | Variable 5 |
|---|---|---|---|---|---|
| 1 | $w_{i1}$ | $w_{i2}$ | 0 | $w_{i4}$ | $w_{i5}$ |
| 2 | $b_{i1}$ | $w_{i2}$ | 0 | $b_{i4}$ | $b_{i5}$ |
| 3 | $w_{i1}$ | $b_{i2}$ | 0 | $b_{i4}$ | $w_{i5}$ |
| 4 | $b_{i1}$ | $b_{i2}$ | 0 | $w_{i4}$ | $b_{i5}$ |
| 5 | $w_{i1}$ | $w_{i2}$ | 1 | $w_{i4}$ | $b_{i5}$ |
| 6 | $b_{i1}$ | $w_{i2}$ | 1 | $b_{i4}$ | $w_{i5}$ |
| 7 | $w_{i1}$ | $b_{i2}$ | 1 | $b_{i4}$ | $b_{i5}$ |
| 8 | $b_{i1}$ | $b_{i2}$ | 1 | $w_{i4}$ | $w_{i5}$ |
| 9 | $w_{i1}$ | $w_{i2}$ | 2 | $w_{i4}$ | $w_{i5}$ |
| 10 | $b_{i1}$ | $w_{i2}$ | 2 | $b_{i4}$ | $b_{i5}$ |
| 11 | $w_{i1}$ | $b_{i2}$ | 2 | $b_{i4}$ | $w_{i5}$ |
| 12 | $b_{i1}$ | $b_{i2}$ | 2 | $w_{i4}$ | $b_{i5}$ |
| 13 | $w_{i1}$ | $w_{i2}$ | 3 | $w_{i4}$ | $b_{i5}$ |
| 14 | $b_{i1}$ | $w_{i2}$ | 3 | $b_{i4}$ | $w_{i5}$ |
| 15 | $w_{i1}$ | $b_{i2}$ | 3 | $b_{i4}$ | $b_{i5}$ |
| 16 | $b_{i1}$ | $b_{i2}$ | 3 | $w_{i4}$ | $w_{i5}$ |

| Sample | Variable 1 | Variable 2 | Variable 3 | Variable 4 | Variable 5 |
|---|---|---|---|---|---|
| 1 | 1 | 1 | 1 | 1 | 1 |
| 2 | 0 | 1 | 2 | 0 | 1 |
| ... | | | ... | | |
| N | 2 | 1 | 0 | 0 | 1 |

| Sample | Spec 1 | Spec 2 |
|---|---|---|
| 1 | 0 | 3 |
| 2 | -1 | 5 |
| ... | ... | ... |
| N | 3 | -4 |

PARALLEL EXTRACTION OF WORST CASE CORNERS

TECHNICAL FIELD

The present disclosure generally relates to integrated circuit design, and more specifically relates to parallel automatic extraction of worst case corners.

BACKGROUND

In semiconductor manufacturing, a process corner is an example of a design-of-experiments technique that refers to a variation of fabrication parameters used in applying an integrated circuit design to a semiconductor wafer. Corners analysis provides a convenient way to measure circuit performance while simulating a circuit with sets of fabrication parameter values that represent the most extreme variations in a manufacturing process. In a manufacturing process, process variables can theoretically have exact values and these exact values can be used to calculate the yield for the process. However, in a real manufacturing process, process variables are subject to a manufacturing tolerance and can fluctuate randomly around their ideal values. In addition, the circuit is expected to operate in different environment conditions, such as low and high temperature. The combined process and environment variation for all of the components results in an uncertain yield for the circuit as a whole. Corners analysis looks at the performance outcomes generated from the most extreme variations expected (the corners), such as variations in the manufacturing process, operating voltage, and temperature of the circuit. Based on this information, it can be determined whether the circuit performance specifications can be met, even when the process and environment variations combine in their most unfavorable patterns.

Corner analysis modules can be included in electronic design automation (EDA) software to perform corner analysis of an integrated circuit (IC) design. Designers often need to design against a large number of corner combinations (e.g., supply voltage ($V_{dd}$), input slew rate, output load, bias current, temperature, transistor model sections, and the like). For a particular design, there typically exist few worst case corners for which the performance is worse than all other corners. Accordingly, simulation time can be significantly saved by designing only against these corners.

The description provided in the background section should not be assumed to be prior art merely because it is mentioned in or associated with the background section. The background section may include information that describes one or more aspects of the subject technology

SUMMARY

The disclosed system provides for simultaneous extraction of worst case corners for multiple circuit performance specifications (herein after "specifications") with significantly higher accuracy compared to existing solutions. The disclosed solution includes the following steps. First, preliminary simulations are performed using initial samples provided by using one-factor-at-a-time (OFAT) sweep method. Next, for each specification, an extended fractional factorial method is used to simulate additional points based on the results from the previous step. Finally, for each specification, local optimization is performed to search for the worst case corners starting from the worst point in the previous two steps.

According to certain aspects of the present disclosure, a method of parallel automatic extraction of worst case corners of a plurality of electronic design automation (EDA) simulation is provided. The method includes generating multiple initial EDA simulation results for a number of specifications of an integrated circuit based on a first algorithm. For all specifications, respective first sets of input samples are generated based on a second algorithm using generated multiple initial simulation results. Using a third algorithm, two or more of the respective first sets of input samples are merged based on a criterion to generate respective second sets of input samples. For all of the specifications, first sets of simulation results are generated using the respective second sets of input samples. The worst case corners for the specifications are determined by applying in parallel local optimization to the first sets of simulation results.

According to certain aspects of the present disclosure, a system for parallel automatic extraction of worst case corners for a number of EDA simulations is provided. The system includes a computing device in communication with a plurality of servers. A server is configured to perform one or more design simulation runs for on one or more specifications associated with an integrated circuit to generate initial EDA simulation results based on initial sets of input samples. The computing device is configured to generate initial sets of input samples based on a first algorithm. For all of the specifications, the computing device generates respective first sets of input samples based on a second algorithm using generated initial EDA simulation results run on the plurality of servers. The computing device further merges, using a third algorithm, two or more of the respective first sets of input samples based on a criterion to generate respective second sets of input samples. The computing device further provides the respective second sets of input samples to servers. For all of the specifications, the computing device receives from the servers first sets of simulation results based on the respective second sets of input samples. The computing device further determines the worst case corners for all of the specifications by applying in parallel local optimization to the first sets of simulation results.

According to certain aspects of the present disclosure, a non-transitory machine-readable media is provided. The non-transitory machine-readable storage medium includes machine-readable instructions for causing a processor to execute a method for parallel automatic extraction of worst case corners. The method includes generating multiple initial EDA simulation results for a number of specifications of an integrated circuit based on a first algorithm. For all specifications, respective first sets of input samples are generated based on a second algorithm using generated multiple initial simulation results. Using a third algorithm, two or more of the respective first sets of input samples are merged based on a criterion to generate respective second sets of input samples. For all of the specifications, first sets of simulation results are generated using the respective second sets of input samples. The worst case corners for the specifications are determined by applying in parallel local optimization to the first sets of simulation results. A cache of simulated samples shared across the specifications is used to make sure no input sample is simulated twice.

According to certain aspects of the present disclosure, a system for code coverage mapping is provided. The system includes means for simulating configured to generate multiple initial EDA simulation results for a number of specifications of an integrated circuit based on a first algorithm.

The system further includes means for processing configured to generate, for all specifications, respective first sets of input samples based on a second algorithm using generated multiple initial simulation results. The means for processing is further configured to merge, using a third algorithm, two or more of the respective first sets of input samples based on a criterion to generate respective second sets of input samples. The means for processing is further configured to generate, for all of the specifications, first sets of simulation results using the respective second sets of input samples. The means for processing is further configured to determine the worst case corners for the specifications by applying in parallel local optimization to the first sets of simulation results.

It is understood that other configurations of the subject technology will become readily apparent to those skilled in the art from the following detailed description, wherein various configurations of the subject technology are shown and described by way of illustration. As will be realized, the subject technology is capable of other and different configurations and its several details are capable of modification in various other respects, all without departing from the scope of the subject technology. Accordingly, the drawings and detailed description are to be regarded as illustrative in nature and not as restrictive.

BRIEF DESCRIPTION OF THE DRAWINGS

The accompanying drawings, which are included to provide further understanding and are incorporated in and constitute a part of this specification, illustrate disclosed embodiments and together with the description serve to explain the principles of the disclosed embodiments. In the drawings.

In one or more implementations, not all of the depicted components in each figure may be required, and one or more implementations may include additional components not shown in a figure. Variations in the arrangement and type of the components may be made without departing from the scope of the subject disclosure. Additional components, different components, or fewer components may be utilized within the scope of the subject disclosure.

DETAILED DESCRIPTION

The detailed description set forth below is intended as a description of various implementations and is not intended to represent the only implementations in which the subject technology may be practiced. As those skilled in the art would realize, the described implementations may be modified in various different ways, all without departing from the scope of the present disclosure. Accordingly, the drawings and description are to be regarded as illustrative in nature and not restrictive.

General Overview

The disclosed system provides for parallel automatic extraction of worst case corners of a number of electronic design automation (EDA) simulations (hereinafter "simulations"). Designers of electronic circuits (e.g., analog or digital circuits) have to test their design under a large number of corner combinations, although for a particular design, there may be a few worst case corners for which the performance can be worse than all other corners. The disclosed solution enables identifying the few worst case corners so that the designer can design against this limited number of corners. This can result in significant simulation time saving. The subject solution includes a number of advantageous features. For example, the disclosed solution can achieve nearly the same accuracy in extracting worst case corners as the well-known full factorial method, while at the same time can save a large number of simulations.

Example System Architecture

Figure 1:
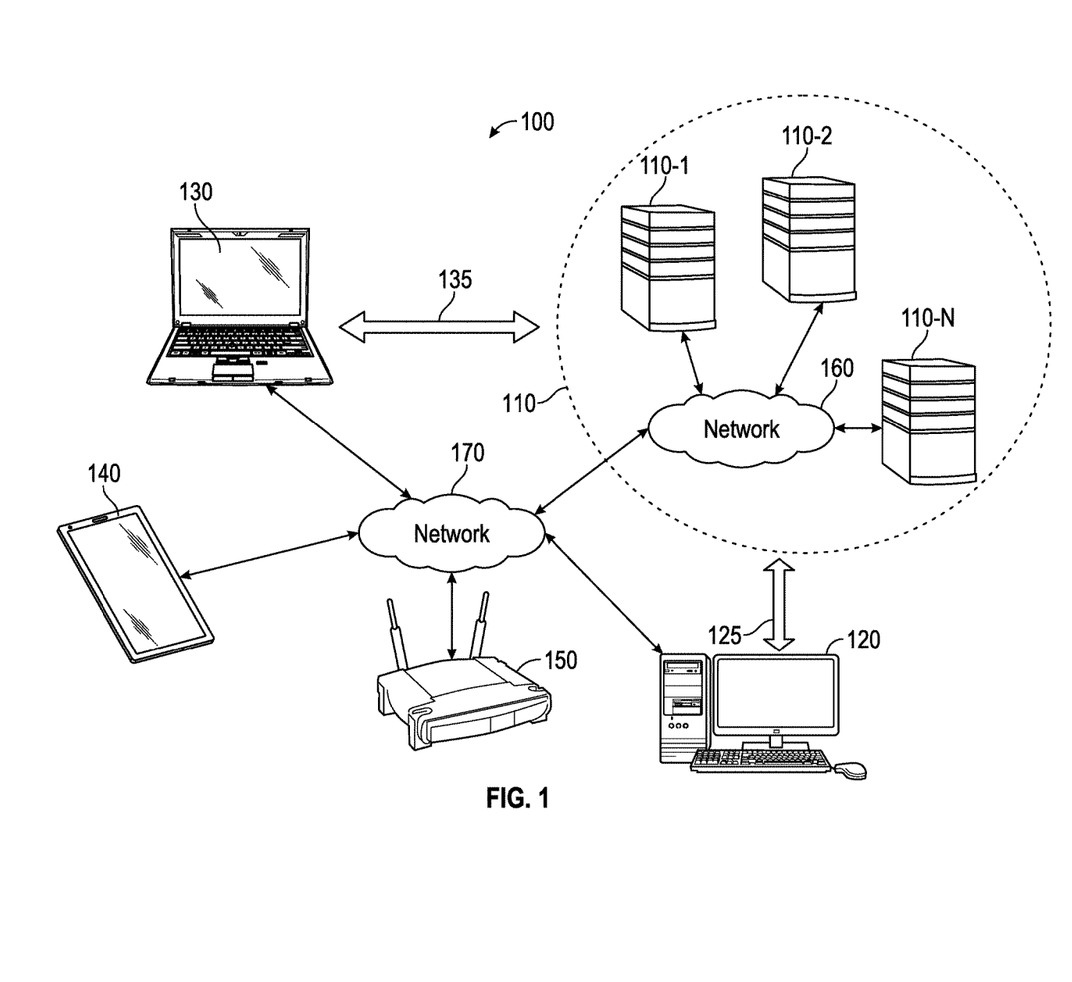
FIG. 1 illustrates an example environment in which the subject technology is used.

FIG. 1 illustrates an example architecture 100 for an environment in which the subject technology is used. The architecture 100 includes a server farm 110 including a number of servers (e.g., 110-1, 110-2 . . . 110-N) communicatively coupled through a network 160 and a computing device (e.g., a workstation) 120 coupled to one or more of the servers of the server farm 110 via a communication link 125. In some aspects of the disclosure, the architecture 100 includes a mobile computer 130, a mobile devices (e.g., a smartphone or PDA) 140, and an access point 150 communicatively coupled via a network 170. In one or more aspects, one or more of the servers of the server farm 110 and the workstation 120 are also connected to the network 160 directly or via the network 170. The access point 150 may facilitate communication of various computers and devices with the network 170. Examples of the networks 160 and 170 include any one or more of a personal area network (PAN), a local area network (LAN), a campus area network (CAN), a metropolitan area network (MAN), a wide area network (WAN), a broadband network (BBN), the Internet, and the like. Further, the networks 160 and 170 can include, but are not limited to, any one or more of the following network topologies, including a bus network, a star network, a ring network, a mesh network, a star-bus network, a tree or hierarchical network, and the like.

In some aspects, the mobile computer 130 is also capable of using a more robust and higher bandwidth communication link 135 similar to the communication link 125 for communicating with one or more servers of the server farm 110. In some aspects, the mobile computer 130 can have the capabilities of performing the functionalities of the workstation 120 and be actually used to perform those functionalities as disclosed herein. The servers 110 can be any device having an appropriate processor, memory, and communications capability for hosting simulation services, for example, simulation of analog and digital circuitry. In some aspects, one or more of the servers 110 can be a cloud computing server of an infra-structure-as-a-service (IaaS) that is able to support platform-as-a-service (PaaS) and software-as-a-service (SaaS) services. The work station 120 or the mobile computer 130 can support simulations by, for example, providing input samples for simulation runs performed by the servers of the server farm 110. In one or more aspects, the work station 120 or the mobile computer 130 can execute one or more algorithms that support making the simulations more efficient based on the subject methodology described hereinafter.

In some aspects, the communication links 125 and 135 are high bandwidth and low latency communication channels (e.g., interfaces). The interfaces can optimize performance and functionality when providing a transactional interface, such as between the workstation 120 or the mobile computer 130 and one or more servers of the server farm 110. In one or more aspects, a user may access the workstation 120 or the mobile computer 130 via the mobile device 140, for example, to initiate transfer of one or more files or other transactions between the workstation 120 or the mobile computer 130 and the servers of the server farm 110.

The simulations can be performed for one or more specifications. Each specification can involve multiple variables. For example, the specification can be a time delay ($T_D$) associated with a circuit-under-design (CUD) being smaller than a first value (e.g., 100 nsec) and/or larger than a second value (e.g., 50 nsec). The variables involved in the specification can be a bias voltage, an operating temperature, one or more process dependent parameters such as transistor model parameters, or the like. The input samples for simulation runs can be generated by varying the values of the variables over a predetermined range. For example, the operating temperature may be varied between 0° C. to 70° C., for a commercial application, or between −40° C. to 85° C., for an industrial application. For manufacturing process, for example, for a complementary metal-oxide-semiconductor (CMOS) process a number of corners, such as fast-fast (FF), slow-slow (SS), slow-fast (SF), fast-slow (FS), and typical-typical (TT) are commonly used, where the first letter refers to an N-channel MOS (NMOS) device and the second letter refers to a P-channel MOS (PMOS) device, and fast and slow refer to the carrier mobility in the devices that defines the speed of the device. For instance, a FS corner corresponds to a fast NMOS and slow PMOS device in the CUD.

Figure 2:
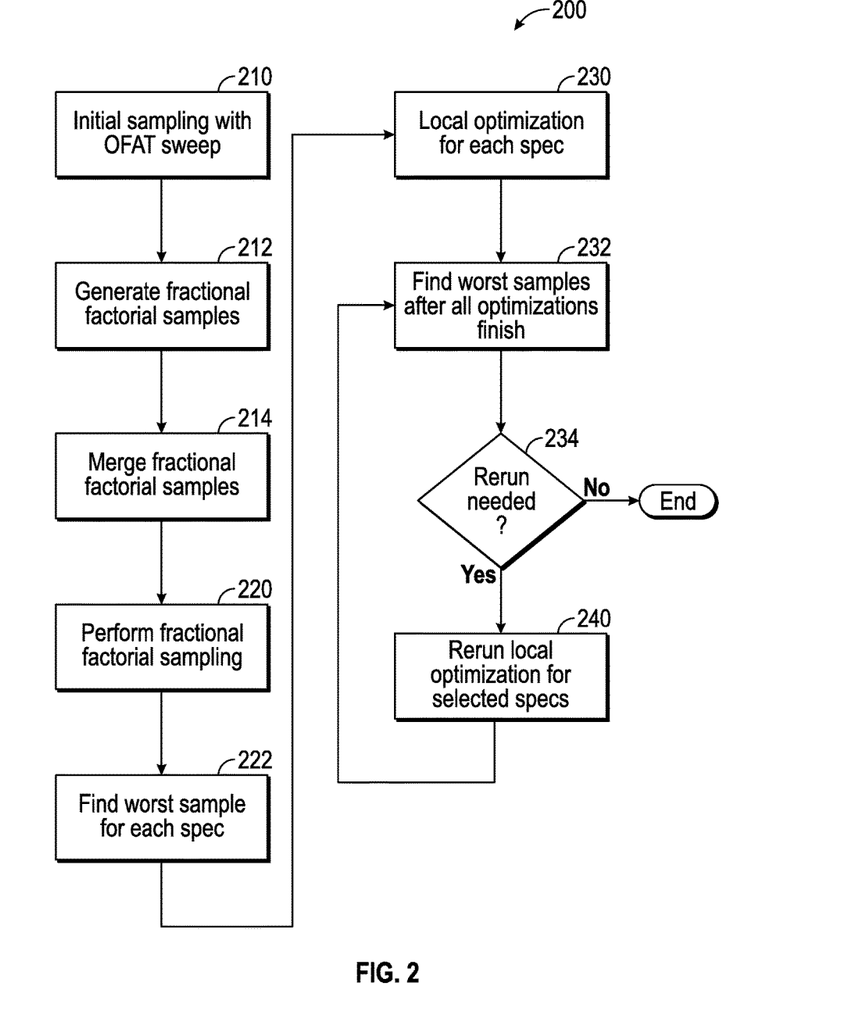
FIG. 2 is a flow diagram illustrating an example process for parallel automatic extraction of worst case corners for a number of electronic design automation (EDA) simulations according to certain aspects of the disclosure.

FIG. 2 is a flow diagram illustrating an example process 200 for parallel automatic extraction of worst case corners of a number of EDA simulations according to certain aspects of the disclosure. The process 200 begins by proceeding to step 210, when an initial sampling is performed using a first algorithm such as a one-factor-at-a-time (OFAT) sweep method. Sampling includes generating input samples by the workstation 120 or the mobile computer 130 of FIG. 1 and submitting the generated input samples to servers of the server farm 110 of FIG. 1 for simulation. In an OFAT sweep method, the input samples are generated by sweeping all variables separately, and for each variable, sweeping the entire set of possible values of that variable, while values of all other variables are kept at their nominal values. It is understood that for k variables with ($N_1, N_2 \ldots N_k$) values, the OFAT sweep method generates $S=\Sigma_{j=1}^{k} N_j - k + 1$ initial samples.

Figure 3A:
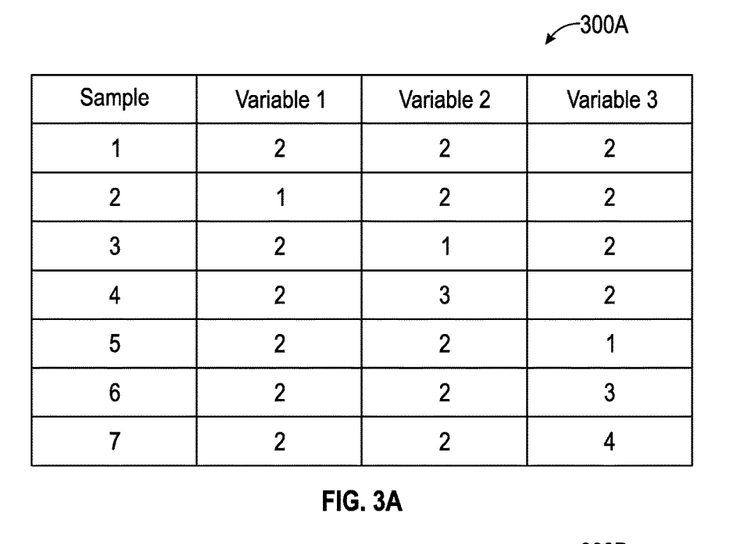
FIGS. 3A and 3B are tables illustrating examples of initial input samples for three variables and corresponding EDA simulation results for two specifications according to certain aspects of the disclosure.

For example, for the three variables (e.g., Variable 1, Variable 2, and Variable 3) of Table 300A of FIG. 3A, $N_1$, $N_2$, and N3 are 2, 3, and 4, respectively, and the number of samples is S=7. Example nominal values used for the three variables are 2, 2, and 2. In one or more aspects, the initial samples are generated by the workstation 120 or the mobile computer 130 of FIG. 1. The initial sampling includes performing simulations in parallel by servers of the server farm 110 of FIG. 1, using the generated samples. In some aspects, the parallel simulation is performed by servers of the server farm 110. An example simulation results using the initial input samples of Table 300A for two specifications (e.g., Spec 1 and Spec 2) are shown in Table 300B of FIG. 3B.

Returning to flow diagram 200, the process 200 continues with step 212, when fractional factorial samples are generated. The goal of fractional factorial sampling is to selectively explore the variable space for each specification based on initial sampling results in order to reduce the number of simulations compared to the OFAT method and make the process of extracting the worst corners more efficient.

Figure 3B:
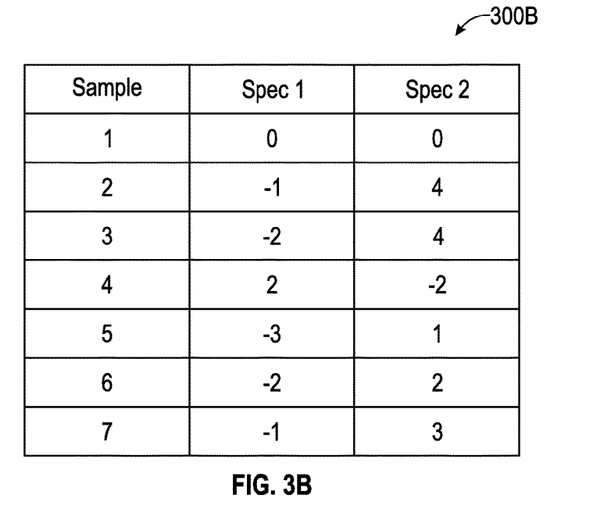
Figure 4:
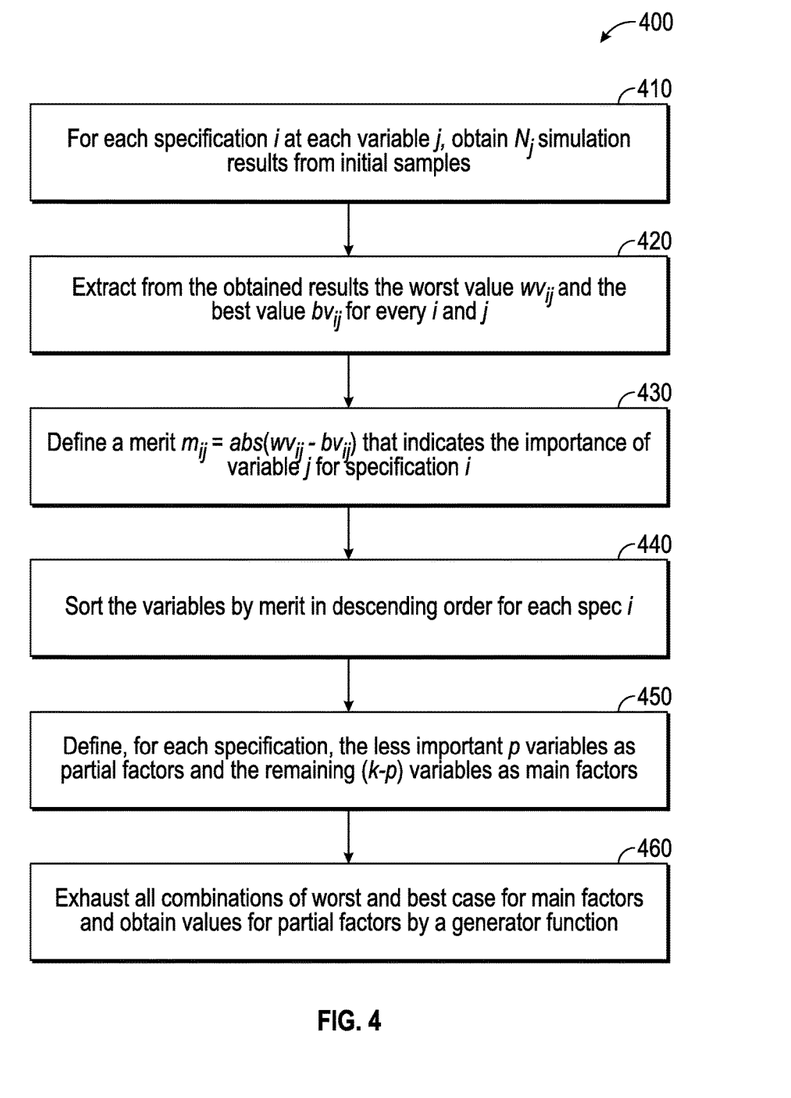
FIG. 4 is a flow diagram illustrating an example algorithm for generating first sets of input samples based on simulation results of the Table of FIG. 3B according to certain aspects of the disclosure.

The fractional factorial sampling is performed based on a second algorithm (e.g., process 400), the flow diagram of which is shown in FIG. 4. The process 400 generates first sets of input samples based on simulation results of the Table 300B of FIG. 3B. The process 400 begins by proceeding to step 410, when for each specification i at each variable j, simulation results are obtained from initial samples. For example, Table 300B shows that for Spec 1 and Spec 2, seven simulation results are obtained. From these results, samples 1 and 2 correspond to Variable 1, samples 1, 3, and 4 correspond to Variable 2, and samples 1, 5, 6, and 7 correspond to Variable 3.

The process 400 continues at step 420, when from the respective simulations results of each specification i, the worst value $wv_{ij}$ and the best value $bv_{ij}$ for each i and j is obtained. For the example results shown in Table 300B, for the first specification (Spec 1) and Variable 1, the $wv_{11}$ and $bv_{11}$ are determined from the samples 1 and 2 to be −1 and 0, for Variable 2, the $wv_{12}$ and $bv_{12}$ are determined from the samples 1, 3 and 4 to be −2 and 2, and for Variable 3, the $wv_{13}$ and $bv_{13}$ are determined from the samples 1, 5, 6 and 7 to be −3 and 0. Next, at step 430, a merit $m_{ij}=abs(wv_{ij}-bv_{ij})$ that indicates the importance of variable j for the specification i is defined. For example, for Spec 1 of Tables 3B, $m_{11}=1$, $m_{12}=4$, and $m_{13}=3$ and for Spec 2, $m_{21}=4$, $m_{22}=6$, and $m_{23}=3$.

In a next step 440 of process 400, for each specification i, the variables are sorted by merit in a descending order. For example, the order for Spec 1 would be 2, 3, 1 and the order for Spec 2 would be 2, 1, 3, as determined from the values of the respective merits of the Spec 1 and Spec 2. The order numbers (e.g., 2, 1, 3 for Spec 2) refer to the variable numbers in Table 300A. The process 400 continues with defining, at step 450, for each specification, the less important p variables as partial factors and the remaining (k-p) variables as main factors. For example, referring to Table 300A for Spec 1, the main factors are Variables 2 and 3 and the partial factor is Variable 1, which is the least important variable according to the order of 2, 3, 1, determined above for Spec 1.

Finally at step 460, the fractional factorial sampling exhausts all combinations of worst and best cases determined above for main factors and for partial factors values are obtained by a generator function as described in more details herein. This is an important step that significantly reduces the number of simulations compared to the OFAT method used to generate the initial samples. It can be shown that the total number of simulations for each specification can be reduced to $2^{(k-p)}$, where (k-p) is the number of main factors.

Figure 5:
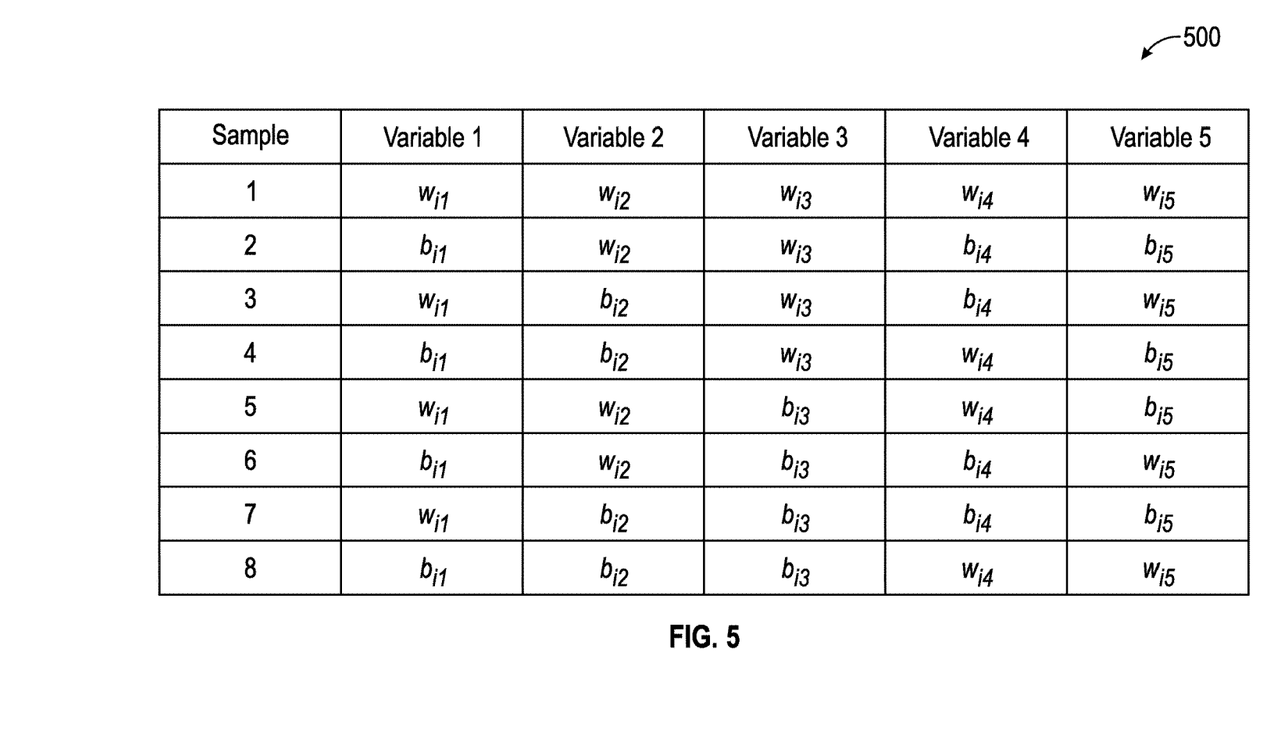
FIG. 5 is a table illustrating example input samples generated for a specification with five variables having three variables considered main factors, according to certain aspects of the disclosure.

An example input sample generated for a specification i with five variables (e.g., Variable 1 through Variable 5) having three variables considered as main factors is shown in Table 500 of FIG. 5. From the five variables of Table 500, the first three variables (e.g., Variable 1 through Variable 3) are considered main factors and the two remaining variables (Variable 4 and Variable 5) are considered partial factors. For the main factors, as discussed above, the fractional factorial sampling exhausts all combinations of worst and best cases. For the partial factors, the example generator function used can be a Boolean function of the main factors, for example, an exclusive OR (XOR) function. For example, Variable 4 is generated based on XOR of Variables 1 and 2 (e.g., XOR (1, 2)) and Variable 5 is generated based on XOR of Variables 1 and 3 (e.g., XOR (1, 3)). For instance, for sample 5 of Table 500, Variables 1 and 2 are $w_{i1}$ and $w_{i2}$, respectively, for which the XOR $(1,2)=wi_4$ and Variables 1 and 3 are $w_{i1}$ and $b_{i3}$, respectively, for which the XOR $(1,2)=b_{i5}$. It is noted that in determining of the exclusive OR result, the logical values of the variables are used. That is to say, $w_{ij}$ is considered logical "0" and $b_{ij}$ is considered as logical "1".

Figure 6A:
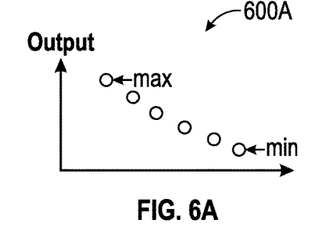
FIGS. 6A through 6C are diagrams illustrating example plots of simulation output values versus input variables for simple and complex variables according to certain aspects of the disclosure.
Figure 6B:
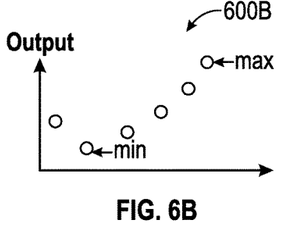

Returning to process 200 of FIG. 2, at step 214, the number of simulations is further reduced by merging fractional factorial samples. Fractional factorial samples may be insufficient for exploring the design space in situations where the output (e.g., simulation results) has highly complex relationship with some variables and so complex variable and detection of complex variables, which will now be described, may be needed. Examples of these situations include model sections or circuit conditions with substantially wide range of variation such that the circuit under design can be pushed into different states. Detecting high complexity situations is possible by observing a pattern of OFAT sweep samples as shown in plots 600A through 600C of FIGS. 6A through 6C. For non-complex variables, which include most variables, as shown in plots 600A and 600B, the output (e.g., simulation results) varies monotonically with values of the variables. For instance, the output versus values of the variables is approximately a linear function (FIG. 6A) or has only one of a minimum or a maximum value that is not on a boundary (e.g., approximately quadratic, as shown in FIG. 6B). For non-complex variables, sweeping the entire range of variable when generating fractional factorial samples is not necessary, and only values of the variable corresponding to the minimum (min) and maximum (max) values of the output can be used.

Figure 6C:
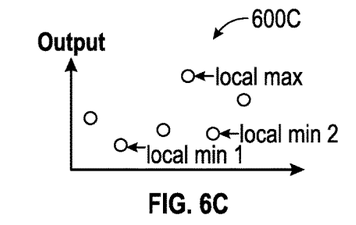
Figure 7:
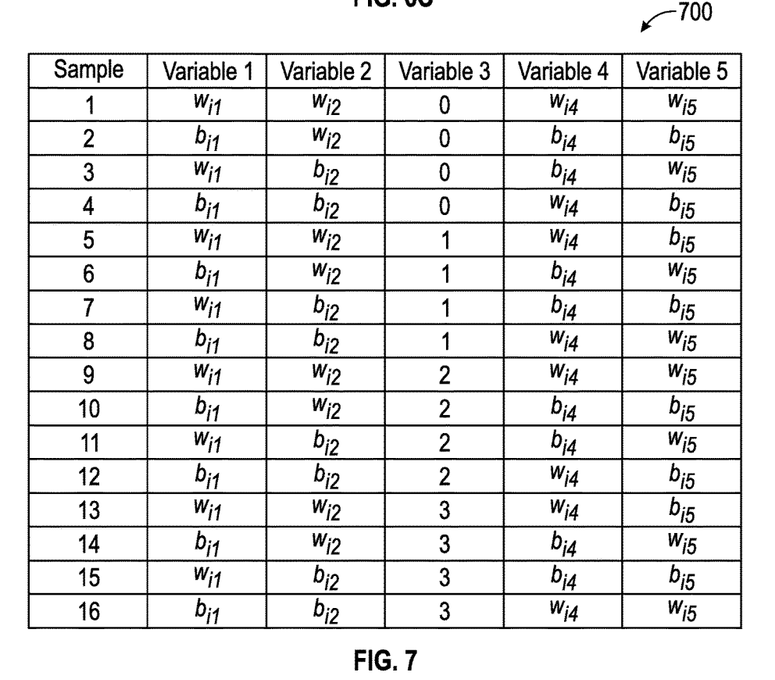
FIG. 7 is a table illustrating an example input sample generated for a specification with five variables including a complex variable according to certain aspects of the disclosure.

For a complex variable, in the variation of the output versus the values of the variables, as shown in plot 600C of FIG. 6C, at least two local extremum (e.g., local min or local max) can be detected. A local extremum is defined as a point on the plot that is not on the boundary and its value (e.g., output value) is either greater or smaller than both neighboring points. For complex variables, it is likely that the variables cannot be represented by their minimum and maximum values, and the entire ranges of these variables have to be swept when generating fractional factorial samples. Examples of input samples generated for a specification with five variables including a complex variable is shown in Table 700 of FIG. 7. In Table 700, Variables 1 and 2 are non-complex variables and therefore only their worst and best values (max and min values) are used. Variable 3 is a complex variable with 4 values, all of which are swept resulting in $2^4=16$ samples. variables 4 and 5 are partial variables and their values are determined using a function generator as explained above with respect to Table 500 of FIG. 5. Now that the complex variables and their limitations are introduced the concept of merging of fractional factorial samples is discussed with respect FIG. 8 below.

Figure 8:
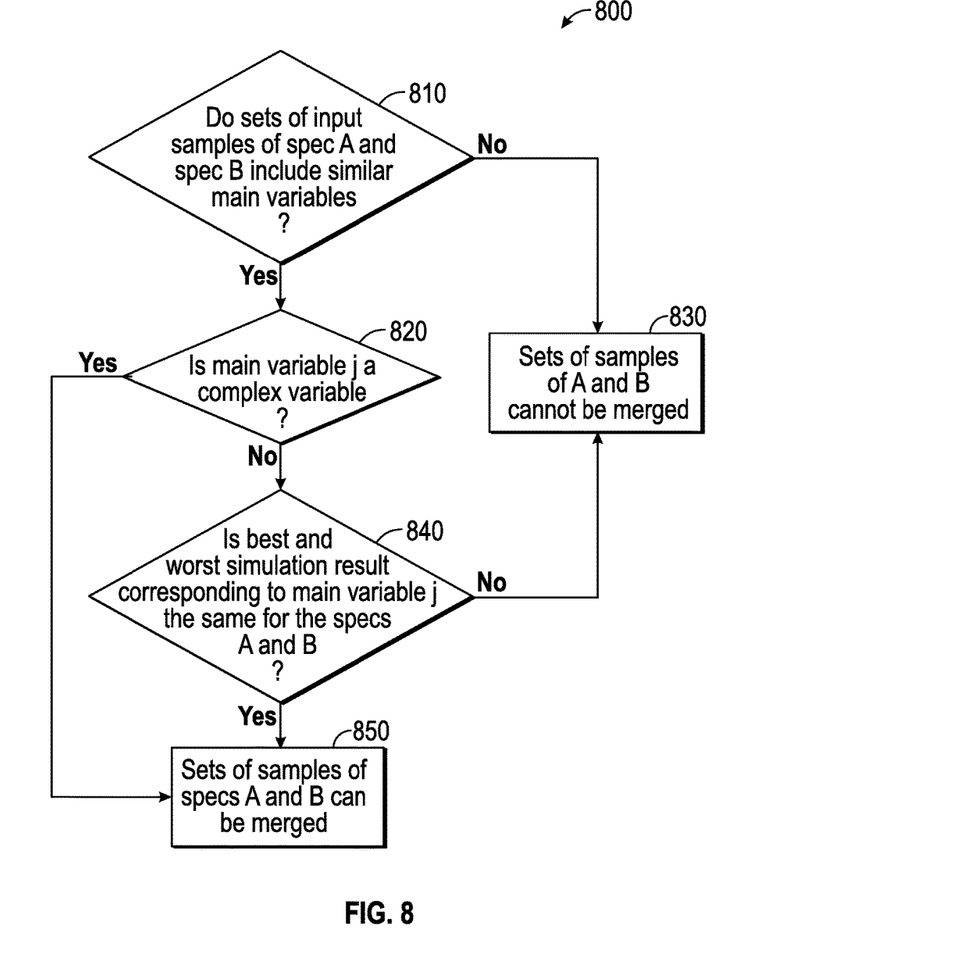
FIG. 8 is a flow diagram illustrating an example algorithm for merging fractional factorial samples according to certain aspects of the disclosure.

Returning to step 214 of process 200, merging of fractional factorial samples (e.g., of two specifications such as Spec A and Spec B) is performed according to a third algorithm (process 800), the flow diagram of which is shown in FIG. 8. The process 800 begins by proceeding to control step 810, where it is determined whether the sets of input samples of Spec A and Spec B include similar main factors (regardless of their orders). If the answer is no, it is established, at step 830, that samples from Spec A and Spec B cannot merge. Otherwise, if the answer is yes, at the control steps 820 and 840 it is checked whether either main variable j is a complex variable or whether the set of best and worst values (e.g., $wv_{ij}$ and $bv_{ij}$) for the main variable j is the same for Specs A and B, and if the answer to either is yes, the control is passed to step 850, where it is established that Spec A and Spec B can merged. Otherwise, the control is passed to step 830.

Again returning to the process 200 of FIG. 2, the process 200 continues with step 220, when fractional factorial sampling is performed by servers of the server farm 110 of FIG. 1, as explained above. The process 200 continues with step 222, when worst samples for each specification are determined. For example, for samples of Spec 1 and Spec 2 of Table 300B, the worst cases are sample 5 and sample 4, respectively. As another example, in Table 700 of FIG. 7, the worst sample is sample 1, where all variables (Variables 1 through 5) have their worst values. The process 200 continues with step 230, when local optimization is performed. For each specification, a local optimization is performed (e.g., by the servers of the server farm 110) starting from the current worst sample as the starting point. This further refines the solution by finding the worst sample around the starting point. Any known local optimization algorithm, such as the Broyden-Fletcher-Goldfarb-Shanno (BFGS) algorithm or the Conjugate Gradient or Brent-Powell algorithm can be used to perform the local optimization.

The local optimization runs for a number of specifications can be performed in parallel using the servers of the server farm 110. A cache shared across all specifications is used to record a list of all simulated samples in order to make sure the same sample is not simulated more than once. The cache can be any storage medium of the workstation 120 or the mobile computer 130 of FIG. 1. Example N input data samples after combining OFAT and fractional factorial samples for submission to servers of the server farm 110 of FIG. 1 are shown in the Table 900A of FIG. 9A.

Figure 9A:
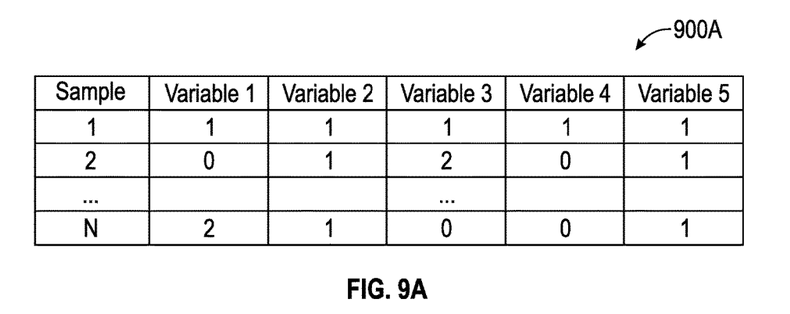
FIGS. 9A and 9B are tables illustrating examples of input samples after combining OFAT and fractional factorial samples and corresponding simulation results according to certain aspects of the disclosure.
Figure 9B:
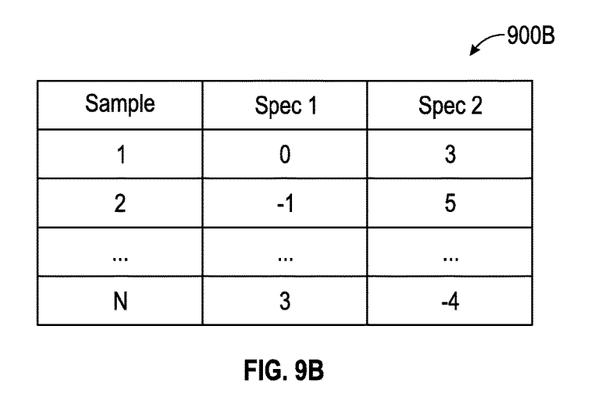

Returning to the process 200, the process 200 continues with step 232, when worst samples are found after all optimizations finish. After all samples of Table 900A are simulated for a number of specifications, for Example Spec 1 and Spec 2, the example results shown in Table 900B of FIG. 9B are obtained. As seen from Table 900B, for spec 1, sample 2 results in the worst value of −1 after the simulation, so sample 2 is selected as the worst sample for spec 1 and used as the starting point local optimization of Spec 1. Similarly, sample N may be selected as the starting point for local optimization of Spec 2.

Once the starting points are selected, the simultaneous optimization runs begin for Specs 1 and 2 in parallel by the servers of the server farm 110 of FIG. 1. For example, for Spec 1, minimization run is performed with a starting point (e.g., variables set) (0, 1, 2, 0, 1) corresponding to sample 2 of Table 900A with the initial value −1 for Spec 1. For Spec 2, minimization run is performed a starting point (2, 1, 0, 0, 1) corresponding to sample N of Table 900A with the initial value −4 of Table 900B for sample N of Spec 2. In some embodiments, in each optimization additional input points are submitted for simulation to obtain a gradient direction. For example, to minimize Spec 1, the optimization algorithm may further submit variable sets (1, 1, 2, 0, 1), (0, 2, 2, 0, 1), (0, 1, 3, 0, 1), (0, 1, 2, 1, 1), and (0, 1, 2, 0, 2) to determine the gradient direction. These variable sets are selected from the same variable sets used for simulations up to the local optimization runs.

Returning again to the process 200, at the control step 234 it is determined whether a rerun is needed as described herein. If no rerun is needed the process 200 ends. Otherwise, at step 240, rerun of local optimization for selected specification is performed, as explained herein. In rare cases, the starting point for local optimization may not be good enough and the local optimization may not converge to a global optimal point. This case can be detected, for example, by performing the following steps: A) recording worst values ($W_1, W_2, \ldots, W_D$) found by local optimization for each specification after each local optimization is finished, 2) recording a worst value ($W'_1, W'_2, \ldots, W'_D$) found for each specification by iterating over all simulated points after each local optimization is finished, 3) for any specification i that Wi is not equal to W'i, restarting the local optimization by using W'i as the starting point, and 4) repeating the above process until no specifications has Wi not equal to W'i.

In some embodiments, the simulations for all optimizations are run in parallel, but optimization processes are independent from one another from an algorithm perspective. For example, for the Spec 1 of Table 900B, an optimization algorithm may submit the points (1, 1, 2, 0, 1), (0, 2, 2, 0, 1), (0, 1, 3, 0, 1), (0, 1, 2, 1, 1), (0, 1, 2, 0, 2), but none result in a smaller value compared to initial value −1, so optimization stops and concludes that the worst value for Spec 1 is −1, which gives a value of $W_1$=−1 for Spec 1. For optimizing Spec 2, a point (3, 1, 0, 0, 1) is simulated resulting in Spec 1=−2 that is worse than the local optimum −1 found by optimization of Spec 1. Thus, after all specs finish, $W_1'$=−2. In this case, the optimization for Spec 1 has to rerun, with starting point (3, 1, 0, 0, 1) and an initial value −2.

Figure 10:
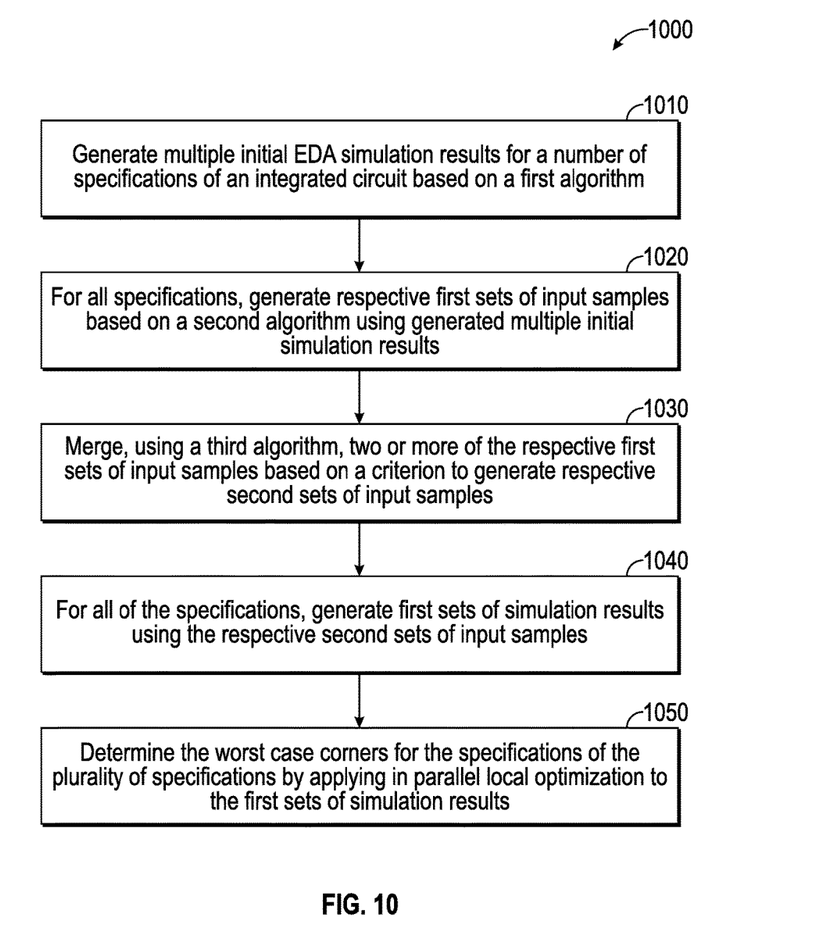
FIG. 10 is a flow diagram illustrating an example method for parallel automatic extraction of worst case corners of a number of EDA simulations according to certain aspects of the disclosure.

FIG. 10 is a flow diagram illustrating an example method 1000 for parallel automatic extraction of worst case corners for a number of EDA simulations using the environment of FIG. 1 according to certain aspects of the disclosure. While FIG. 10 is described with reference to FIG. 1, it should be noted that the process steps of FIG. 10 may be performed by other systems. The process 1000 begins by proceeding to step 1010, when multiple initial EDA simulation results (e.g., samples of Table 300B of FIG. 3B) are generated (e.g., by 110 of FIG. 1) for a number of specifications (e.g., Spec 1 and Spec 2 of FIG. 3B) of an integrated circuit based on a first algorithm (e.g., OFAT method used to generate samples of Table 300A of FIG. 3A). The process 1000 continues with step 1020, when, for all specifications, respective first sets of input samples are generated (e.g., by 120 or 130 of FIG. 1) based on a second algorithm (e.g., process 400 of FIG. 4) using generated multiple initial simulation results (e.g. of Table 300B of FIG. 3B, generated by 110 of FIG. 1). At step 1030, using a third algorithm (e.g., process 800 of FIG. 8), two or more of the respective first sets of input samples (e.g., Spec A and Sec B of FIG. 8) are merged (e.g., by 120 or 130 of FIG. 1) based on a criterion to generate respective second sets of input samples. The process 1000 continues with step 1040, when, for all of the specifications, first sets of simulation results are generated (e.g., by 110 of FIG. 1) using the respective second sets of input samples. Finally at step 1050, the worst case corners for the specifications are determined (e.g., by 120 or 130 of FIG. 1) by applying in parallel local optimization to the first sets of simulation results.

Hardware Overview

Figure 11:
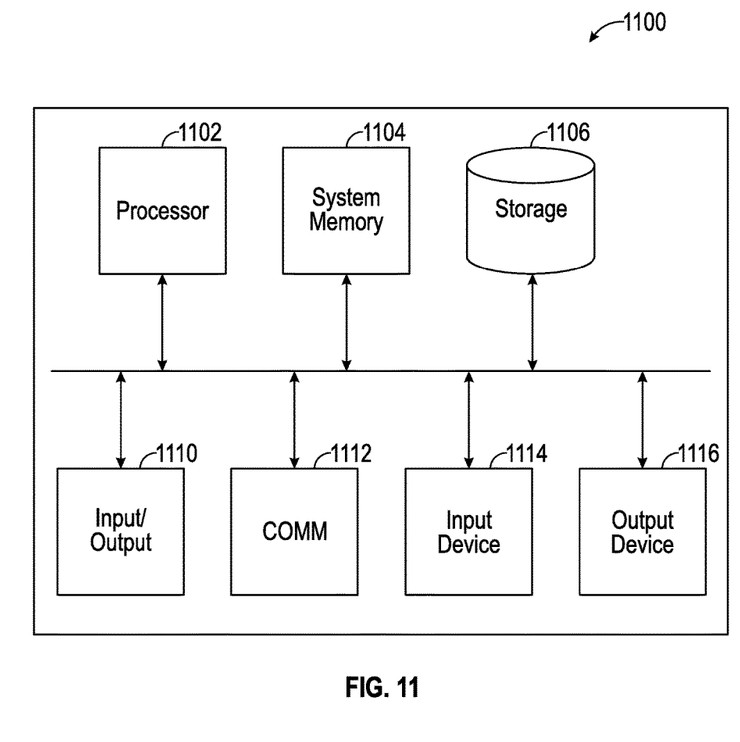
FIG. 11 is a block diagram illustrating an example computer system with which code for parallel automatic extraction of worst case corners of a number of EDA simulations can be implemented.

FIG. 11 is a block diagram illustrating an example computer system with which code for parallel automatic extraction of worst case corners for a number of EDA simulations can be implemented. In some aspects, the computer system 1100 may represent the server 110, the computing device 120, the mobile computer 130, and the mobile device 140 of FIG. 1. In certain aspects, the computer system 1100 may be implemented using hardware or a combination of software and hardware, either in a dedicated server, or integrated into another entity, or distributed across multiple entities.

Computer system 1100 (e.g., server 110 or the computing device 120) includes a bus 1108 or other communication mechanism for communicating information, and a processor 1102 coupled with bus 1108 for processing information. According to one aspect, the computer system 700 can be a cloud computing server of an infra-structure-as-a-service (IaaS) that is able to support platform-as-a-service (PaaS) and software-as-a-service (SaaS) services.

Computer system 1100 can include, in addition to hardware, code that creates an execution environment for the computer program in question, e.g., code that constitutes processor firmware, a protocol stack, a database management system, an operating system, or a combination of one or more of them stored in an included memory 1104, such as a Random Access Memory (RAM), a flash memory, a Read Only Memory (ROM), a Programmable Read-Only Memory (PROM), an Erasable PROM (EPROM), registers, a hard disk, a removable disk, a CD-ROM, a DVD, or any other suitable storage device, coupled to bus 1108 for storing information and instructions to be executed by processor 1102. The processor 1102 and the memory 1104 can be supplemented by, or incorporated in, special purpose logic circuitry.

The instructions may be stored in the memory 1104 and implemented in one or more computer program products, i.e., one or more modules of computer program instructions encoded on a computer readable medium for execution by, or to control the operation of, the computer system 1100

A computer program as discussed herein does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, subprograms, or portions of code). A computer program can be deployed to be executed on one computer or on multiple computers that are located at one site or distributed across multiple sites and interconnected by a communication network. The processes and logic flows described in this specification can be performed by one or more programmable processors executing one or more computer programs to perform functions by operating on input data and generating output.

Computer system 1100 further includes a data storage device 1106 such as a magnetic disk or optical disk, coupled to bus 1108 for storing information and instructions. Computer system 1100 may be coupled via input/output module 1110 to various devices. The input/output module 1110 can be any input/output module. Example input/output modules 1110 include data ports such as USB ports. In addition, input/output module 1110 may be provided in communication with processor 1102, so as to enable near area communication of computer system 1100 with other devices. The input/output module 1110 may provide, for example, for wired communication in some implementations, or for wireless communication in other implementations, and multiple interfaces may also be used. The input/output module 1110 is configured to connect to a communications module 1112. Example communications modules 1112 (e.g., interface 125 and 135 of FIG. 2) may include networking interface cards, such as Ethernet cards and modems.

In certain aspects, the input/output module 1110 is configured to connect to a plurality of devices, such as an input device 1114 and/or an output device 1116. Example input devices 1114 include a keyboard and a pointing device, e.g., a mouse or a trackball, by which a user can provide input to the computer system 1100. Other kinds of input devices 1114 can be used to provide for interaction with a user as well, such as a tactile input device, visual input device, audio input device, or brain-computer interface device.

According to one aspect of the present disclosure, the server 110 and work station 120 can be implemented using a computer system 1100 in response to processor 1102 executing one or more sequences of one or more instructions contained in memory 1104. Such instructions may be read into memory 1104 from another machine-readable medium, such as data storage device 1106. Execution of the sequences of instructions contained in main memory 1104 causes processor 1102 to perform the process steps described herein. One or more processors in a multi-processing arrangement may also be employed to execute the sequences of instructions contained in memory 1104. In alternative aspects, hard-wired circuitry may be used in place of or in combination with software instructions to implement various aspects of the present disclosure. Thus, aspects of the present disclosure are not limited to any specific combination of hardware circuitry and software.

Various aspects of the subject matter described in this specification can be implemented in a computing system that includes a back end component, e.g., as a data server, or that includes a middleware component, e.g., an application server, or that includes a front end component, e.g., a client computer having a graphical user interface or a Web browser through which a user can interact with an implementation of the subject matter described in this specification, or any combination of one or more such back end, middleware, or front end components.

The term "machine-readable storage medium" or "computer-readable medium" as used herein refers to any medium or media that participates in providing instructions or data to processor 1102 for execution. The term "storage medium" as used herein refers to any non-transitory media that store data and/or instructions that cause a machine to operate in a specific fashion. Such a medium may take many forms, including, but not limited to, non-volatile media, volatile media, and transmission media.

As used in this specification of this application, the terms "computer-readable storage medium" and "computer-readable media" are entirely restricted to tangible, physical objects that store information in a form that is readable by a computer. These terms exclude any wireless signals, wired download signals, and any other ephemeral signals. Storage media is distinct from but may be used in conjunction with transmission media. Transmission media participates in transferring information between storage media. For example, transmission media includes coaxial cables, copper wire and fiber optics, including the wires that comprise bus 1108. Transmission media can also take the form of acoustic or light waves, such as those generated during radio-wave and infra-red data communications. Furthermore, as used in this specification of this application, the terms "computer", "server", "processor", and "memory" all refer to electronic or other technological devices. These terms exclude people or groups of people. For the purposes of the specification, the terms display or displaying means displaying on an electronic device.

In one aspect, a method may be an operation, an instruction, or a function and vice versa. In one aspect, a clause or a claim may be amended to include some or all of the words (e.g., instructions, operations, functions, or components) recited in other one or more clauses, one or more words, one or more sentences, one or more phrases, one or more paragraphs, and/or one or more claims.

Phrases such as an aspect, the aspect, another aspect, some aspects, one or more aspects, an implementation, the implementation, another implementation, some implementations, one or more implementations, an embodiment, the embodiment, another embodiment, some embodiments, one or more embodiments, a configuration, the configuration, another configuration, some configurations, one or more configurations, the subject technology, the disclosure, the present disclosure, other variations thereof and alike are for convenience and do not imply that a disclosure relating to such phrase(s) is essential to the subject technology or that such disclosure applies to all configurations of the subject technology. A disclosure relating to such phrase(s) may apply to all configurations, or one or more configurations. A disclosure relating to such phrase(s) may provide one or more examples. A phrase such as an aspect or some aspects may refer to one or more aspects and vice versa, and this applies similarly to other foregoing phrases.

A reference to an element in the singular is not intended to mean "one and only one" unless specifically stated, but rather "one or more." Underlined and/or italicized headings and subheadings are used for convenience only, do not limit the subject technology, and are not referred to in connection with the interpretation of the description of the subject technology. Relational terms such as first and second and the like may be used to distinguish one entity or action from another without necessarily requiring or implying any actual such relationship or order between such entities or actions.

All structural and functional equivalents to the elements of the various configurations described throughout this disclosure that are known or later come to be known to those of ordinary skill in the art are expressly incorporated herein by reference and intended to be encompassed by the subject technology. Moreover, nothing disclosed herein is intended to be dedicated to the public regardless of whether such disclosure is explicitly recited in the above description. No claim element is to be construed under the provisions of 35 U.S.C. § 112, sixth paragraph, unless the element is expressly recited using the phrase "means for" or, in the case of a method claim, the element is recited using the phrase "step for".

While this specification contains many specifics, these should not be construed as limitations on the scope of what may be claimed, but rather as descriptions of particular implementations of the subject matter. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

The subject matter of this specification has been described in terms of particular aspects, but other aspects can be implemented and are within the scope of the following claims. For example, while operations are depicted in the drawings in a particular order, this should not be understood as requiring that such operations be performed in the particular order shown or in sequential order, or that all illustrated operations be performed, to achieve desirable results. The actions recited in the claims can be performed in a different order and still achieve desirable results. As one example, the processes depicted in the accompanying figures do not necessarily require the particular order shown, or sequential order, to achieve desirable results. In certain circumstances, multitasking and parallel processing may be advantageous. Moreover, the separation of various system components in the aspects described above should not be understood as requiring such separation in all aspects, and it should be understood that the described program components and systems can generally be integrated together in a single software product or packaged into multiple software products.

The title, background, brief description of the drawings, abstract, and drawings are hereby incorporated into the disclosure and are provided as illustrative examples of the disclosure, not as restrictive descriptions. It is submitted with the understanding that they will not be used to limit the scope or meaning of the claims. In addition, in the detailed description, it can be seen that the description provides illustrative examples and the various features are grouped together in various implementations for the purpose of streamlining the disclosure. The method of disclosure is not to be interpreted as reflecting an intention that the claimed subject matter requires more features than are expressly recited in each claim. Rather, as the claims reflect, inventive subject matter lies in less than all features of a single disclosed configuration or operation. The claims are hereby incorporated into the detailed description, with each claim standing on its own as a separately claimed subject matter.

The claims are not intended to be limited to the aspects described herein, but are to be accorded the full scope consistent with the language claims and to encompass all legal equivalents. Notwithstanding, none of the claims are intended to embrace subject matter that fails to satisfy the requirements of the applicable patent law, nor should they be interpreted in such a way.

What is claimed is:

1. A computer implemented method, comprising:
    generating multiple initial simulation results for a plurality of specifications of an integrated circuit by sweeping a value of a first variable in an integrated circuit design over a range and fixing the value of a second variable in the integrated circuit design at a nominal value;
    for each specification of the plurality of specifications:
        generating a respective first set of input samples based on a merit value indicative of an importance of the first variable for each specification, wherein the merit value comprises a best value and a worst value of the specification for the range of the first variable; and
        selecting a main factor and a partial factor based on the merit value;
    merging two or more of the respective first set of input samples based on whether two of the respective first set of input samples share the main factor, and whether the main factor is a complex variable;
    for each specification of the plurality of specifications, generating a first set of simulation results using a respective second set of input samples and applying a generator function of the main factor to estimate the partial factor;
    determining a worst case corner for each specification of the plurality of specifications by applying in parallel local optimization to the initial simulation results; and
    generating an integrated circuit layout for fabrication of an integrated circuit based on the integrated circuit design, when the worst case corner satisfies a predetermined value of at least one of the specifications.

2. The computer implemented method of claim 1, further comprising using a cache of simulated samples shared across the plurality of specifications to make sure no input sample is simulated more than once.

3. The computer implemented method of claim 1, wherein generating the respective first set of input samples is performed in parallel for each specification of the plurality of specifications.

4. The computer implemented method of claim 1, wherein generating the first set of simulation results is performed in parallel for specifications of the plurality of specifications.

5. The computer implemented method of claim 1, wherein applying local optimization is performed in parallel for specifications of the plurality of specifications, and wherein the method further comprises reapplying local optimizations to a selected number of specifications of the plurality of specifications when respected local optimizations fail to converge.

6. The computer implemented method of claim 1, further comprising using a one-factor-at-a-time (OFAT) sweep method for sweeping a value of a first variable in an integrated circuit design over the range.

7. The computer implemented method of claim 1, further comprising selectively exploring variable spaces for each specification of the plurality of specifications based on the multiple initial simulation results.

8. The computer implemented method of claim 7, further comprising:
sorting variables of a specification of the plurality of specifications based on the merit value, wherein the merit value is higher for the main factor than for the partial factor.

9. The computer implemented method of claim 8, wherein a main variable comprises a complex variable, and generating the respective first set of input samples for complex main variable comprises using all sample values.

10. The computer implemented method of claim 1, further comprising removing the respective first set of input samples that can be merged with larger sets of input samples associated with other specifications.

11. A system, comprising:
a computing device in communication with a plurality of servers; and
a server of the plurality of servers is configured to perform one or more design simulation runs for one or more specifications associated with an integrated circuit to generate initial simulation results based on initial sets of input samples, wherein:
the computing device is configured to:
generate initial sets of input samples by sweeping a value of a first variable in an integrated circuit design over a range and fixing the value of a second variable in the integrated circuit design at a nominal value;
for each specification of a plurality of specifications:
generate a respective first set of input samples based on a merit value indicating an importance of the first variable for each specification, wherein the merit value comprises a best value and a worst value of the specification for the range of the first variable;
select a main factor and a partial factor based on the merit value;
merge two or more of the respective first set of input samples based on whether two of the respective first set of input samples share the main factor, or whether the first variable is a complex variable;
provide a respective second set of input samples to the plurality of servers;
for each specification of the plurality of specifications, receive from the plurality of servers a first set of simulation results based on the respective second set of input samples and apply a generator function of the main factor to estimate the partial factor;
determine a worst case corner for each specification of the plurality of specifications by applying in parallel local optimization to the first set of simulation results; and
generate an integrated circuit layout for fabrication of an integrated circuit based on the integrated circuit design, when the worst case corner satisfies a pre-determined value of at least one of the specifications.

12. The system of claim 11, further comprising a cache configured to store simulated samples shared across the plurality of specifications to make sure no input sample is simulated more than once.

13. The system of claim 11, wherein the plurality of servers are configured to generate the first set of simulation results in parallel for specifications of the plurality of specifications.

14. The system of claim 11, wherein the computing device is configured to apply a local optimization in parallel for specifications of the plurality of specifications by submitting suitable input samples to the plurality of servers for simultaneous simulations.

15. The system of claim 14, wherein the computing device is further configured to reapply local optimizations to a selected number of specifications of the plurality of specifications when respected local optimizations fail to converge.

16. The system of claim 11, wherein the computing device is configured to execute a one-factor-at-a-time (OFAT) sweep method for sweeping a value of a first variable in an integrated circuit design over an entire range.

17. The system of claim 11, wherein the computing device is configured to selectively explore variable spaces for each specification of the plurality of specifications based on the initial simulation results, and wherein the computing device is configured to
sort variables of a specification of the plurality of specification based on the merit value, wherein the merit value is higher for the main factor than for the partial factor.

18. The system of claim 17, wherein a main variable comprises a complex variable, and the computing device is configured to generate the respective first set of input samples for a complex main variable by using all sample values.

19. The system of claim 11, wherein the computing device is configured to merge the two or more of the respective first set of input samples by removing the respective first set of input samples that can be merged with larger sets of input samples associated with other specifications.

20. A non-transitory machine-readable storage medium comprising machine-readable instructions for causing a processor to execute a method for parallel extraction of worst case corners, comprising:
generating multiple initial simulation results for a plurality of specifications of an integrated circuit, the multiple initial simulation results being generated based on initial sets of input samples by sweeping a value of a first variable in an integrated circuit design over a range and fixing the value of a second variable in the integrated circuit design at a nominal value;
for each specification of the plurality of specifications:
generating a respective first set of input samples based on a merit value indicating an importance of the first variable for each specification, wherein the merit value comprises a best value and a worst value of the specification for the range of the first variable; and
selecting a main factor and a partial factor based on the merit value;
merging two or more of the respective first set of input samples based on whether two of the respective first sets of input samples share the main factor, and whether the main factor is a complex variable;
for each specifications of the plurality of specifications, generating a first set of simulation results using a respective second set of input samples and applying a generator function of the main factor to estimate the partial factor;
determining a worst case corner for each specification of the plurality of specifications by applying in parallel local optimization to the first set of simulation results;
using a cache of simulated samples shared across the plurality of specifications to make sure no input sample is simulated more than once; and generating an integrated circuit layout for fabrication of an integrated circuit based on the integrated circuit design, when the worst case corner satisfies a predetermined value of at least one of the specifications.

* * * * *